(12) United States Patent  
Leobandung et al.

(10) Patent No.: US 9,368,569 B1  
(45) Date of Patent: Jun. 14, 2016

(54) PUNCH THROUGH STOPPER FOR SEMICONDUCTOR DEVICE

(71) Applicant: International Business Machines Corporation, Armonk, NY (US)

(72) Inventors: Effendi Leobandung, Stormville, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/859,644

(22) Filed: Sep. 21, 2015

(51) Int. Cl.
| | |
|---|---|
| *H01L 29/06* | (2006.01) |
| *H01L 29/66* | (2006.01) |
| *H01L 21/31* | (2006.01) |
| *H01L 21/306* | (2006.01) |
| *H01L 21/225* | (2006.01) |
| *H01L 21/762* | (2006.01) |
| *H01L 21/311* | (2006.01) |
| *H01L 21/02* | (2006.01) |
| *H01L 29/161* | (2006.01) |
| *H01L 21/283* | (2006.01) |
| *H01L 29/78* | (2006.01) |

(Continued)

(52) U.S. Cl.
CPC ...... *H01L 29/0638* (2013.01); *H01L 21/02532* (2013.01); *H01L 21/02636* (2013.01); *H01L 21/2254* (2013.01); *H01L 21/283* (2013.01); *H01L 21/30604* (2013.01); *H01L 21/31* (2013.01); *H01L 21/31116* (2013.01); *H01L 21/76224* (2013.01); *H01L 21/76237* (2013.01); *H01L 21/823412* (2013.01); *H01L 21/823431* (2013.01); *H01L 21/823481* (2013.01); *H01L 27/0886* (2013.01); *H01L 29/0653* (2013.01); *H01L 29/161* (2013.01); *H01L 29/6681* (2013.01); *H01L 29/66795* (2013.01); *H01L 29/785* (2013.01)

(58) Field of Classification Search
CPC . H01L 29/00; H01L 29/0638; H01L 27/0218; H01L 27/088; H01L 29/66795; H01L 29/785; H01L 29/66772; H01L 29/78645; H01L 29/78648; F42C 19/00
USPC .......................................... 257/400; 438/238
See application file for complete search history.

(56) References Cited

U.S. PATENT DOCUMENTS

| | | |
|---|---|---|
| 8,394,690 B2 | 3/2013 | Ikeda et al. |
| 8,420,459 B1 | 4/2013 | Cheng et al. |

(Continued)

OTHER PUBLICATIONS

Kanemura, T., et al; "Improvement of Drive Current in Bulk-FinFET Using Full 3D Process/Device Simulations"; SISPAD; p. 131-134; 2006.

(Continued)

*Primary Examiner* — Walter H Swanson  
(74) *Attorney, Agent, or Firm* — Cantor Colburn LLP; Vazken Alexanian

(57) ABSTRACT

A method for forming a semiconductor device comprises, forming a fin on a semiconductor substrate, forming spacers adjacent to the fin, etching to remove exposed portions of the semiconductor substrate adjacent to the spacers to form a trench adjacent to the spacers, removing the spacers, implanting dopants in the semiconductor substrate adjacent to the fin and in the trench, and performing an annealing process to diffuse the dopants in the semiconductor substrate and form a punch through stopper region below the fin that includes the dopants.

2 Claims, 20 Drawing Sheets

(51) Int. Cl.
*H01L 27/088* (2006.01)
*H01L 21/8234* (2006.01)

(56) References Cited

U.S. PATENT DOCUMENTS

| | | |
|---|---|---|
| 8,604,548 B2 | 12/2013 | Wang et al. |
| 8,932,918 B2 | 1/2015 | Cheng et al. |
| 2010/0327363 A1 | 12/2010 | Nakabayashi |
| 2013/0134506 A1 | 5/2013 | Yagishita |
| 2014/0097487 A1 | 4/2014 | Yen et al. |
| 2014/0377926 A1 | 12/2014 | Kim et al. |
| 2015/0318396 A1* | 11/2015 | Zhu .................. H01L 29/66795 257/192 |

OTHER PUBLICATIONS

Okano, K., et al.; "Process Integration Technology and Device Characteristics of CMOS FinFET on Bulk Silicon Substrate with sub-10 nm Fin Width and 20 nm Gate Length"; IEEE; p. 1-4; 2005.

* cited by examiner

PUNCH THROUGH STOPPER FOR SEMICONDUCTOR DEVICE

BACKGROUND

The present invention generally relates to metal-oxide-semiconductor field-effect transistors (MOSFET), and more specifically, to MOSFET punch through stoppers.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

The drain current of MOSFETS may increase when a parasitic current path between the source and drain is present. Typically, the parasitic current path runs below the channel region of the device, and occurs when the source and drain regions of the MOSFET extend too close to each other proximate to the channel region. A punch through stopper is used to reduce or prevent the parasitic current. Typically, implanting dopants in the bulk substrate forms a punch through stopper that effectively reduces punch through.

SUMMARY

According to one embodiment of the present invention, a method for forming a semiconductor device comprises, forming a fin on a semiconductor substrate, forming spacers adjacent to the fin, etching to remove exposed portions of the semiconductor substrate adjacent to the spacers to form a trench adjacent to the spacers, removing the spacers, implanting dopants in the semiconductor substrate adjacent to the fin and in the trench, and performing an annealing process to diffuse the dopants in the semiconductor substrate and form a punch through stopper region below the fin that includes the dopants.

According to another embodiment of the present invention, a method for forming a semiconductor device comprising, forming a fin on a semiconductor substrate, forming spacers adjacent to the fin, etching to remove exposed portions of the semiconductor substrate adjacent to the spacers to form a trench adjacent to the spacers, removing the spacers, implanting dopants in the semiconductor substrate adjacent to the fin and in the trench, performing an annealing process to diffuse the dopants in the semiconductor substrate and form a punch through stopper region below the fin that includes the dopants, forming an insulator layer on exposed portions of the trench, the punch through stopper, and the semiconductor substrate, epitaxially growing a layer of silicon germanium on exposed portions of the fin, and performing an annealing process to drive germanium into the fin.

According to yet another embodiment of the present invention, a semiconductor device comprises a fin comprising silicon germanium arranged on a semiconductor substrate, a first punch through stopper region arranged in the semiconductor substrate below the fin, a second punch through stopper region arranged in the semiconductor substrate in a trench defined by the semiconductor substrate and the first punch through stopper region, and a gate stack arranged over a channel region of the fin.

DETAILED DESCRIPTION

Figure 1A:
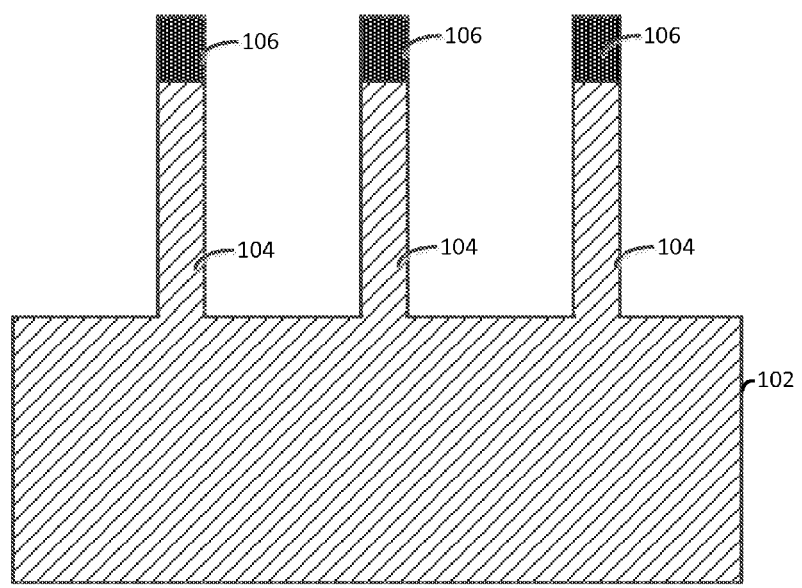
FIG. 1A illustrates a side view of fins with a capping layer arranged on a bulk semiconductor substrate.

Previous methods for forming finFET devices included, forming fins on a bulk semiconductor substrate. After the fins are formed, a semiconductor trench isolation region is formed by depositing an insulator material such as an oxide material. Following the formation of the semiconductor trench isolation region, a punch through stopper is formed by performing a high energy implantation of dopants in the fins. The punch through stopper is operative to reduce or substantially prevent current leakage under the channel region of the devices. Often punch through stoppers include dopants that are implanted under or proximate to the channel region near the source and drain (active regions). The dopants provide an effective punch through stopper.

An epitaxial growth process may be performed that grows silicon germanium with a high germanium concentration on exposed portions of the fins. An annealing process may be performed to diffuse germanium material into the fins to increase the concentration of germanium in the fins.

Such previous methods for forming a punch through stopper in a device having fins with a high concentration of germanium results in the diffusion of germanium into the punch through stopper and undesirable dopants in the channel region.

The methods and resultant structures described herein provide for the formation of an effective punch through stopper for devices with fins having a high concentration of germanium.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

FIG. 1A illustrates a side view of fins 104 arranged on a bulk semiconductor substrate 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

The fins 104 may be formed in the substrate 102 by depositing a hard mask 106 material over the substrate 102. The fins 104 are patterned by, for example, sidewall imaging transfer or reactive ion etching processes.

In some aspects, the fins 104 have a height in a range from about 20 nm to about 35 nm and a width in a range from about 5 nm to about 10 nm. In other aspects, the fins 104 have a height in a range from about 35 nm to about 50 nm and a width in a range from about 8 nm to about 12 nm.

The fin height may generally vary, as it depends on the type of device, and is not intended to be limited. In one aspect, the fin height is in a range from about 20 nm to about 35 nm. In another aspect, the fin height is in a range from about 35 nm to about 50 nm.

Non-limiting examples of suitable materials for the hard mask layer 106 include silicon oxide, silicon nitride, or any combination thereof. The thickness of the hard mask layer 106 is not intended to be limited.

Figure 1B:
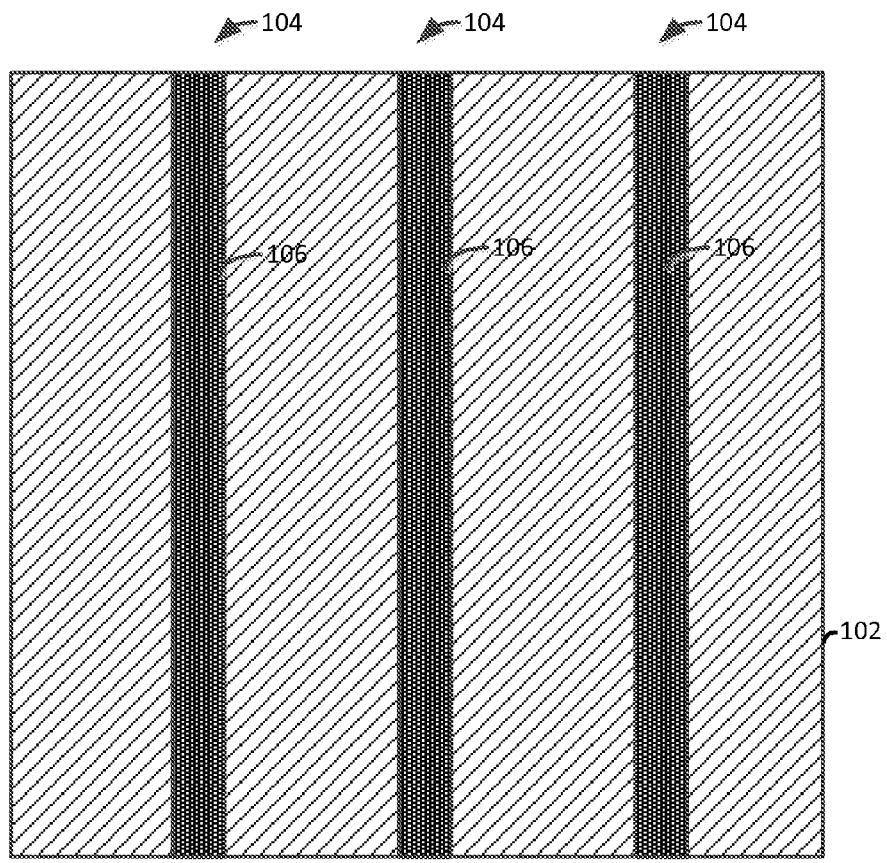
FIG. 1B illustrates a top view of fins with a capping layer arranged on a bulk semiconductor substrate.

FIG. 1B illustrates a top view of the substrate 102 and the fins 104.

Figure 2:
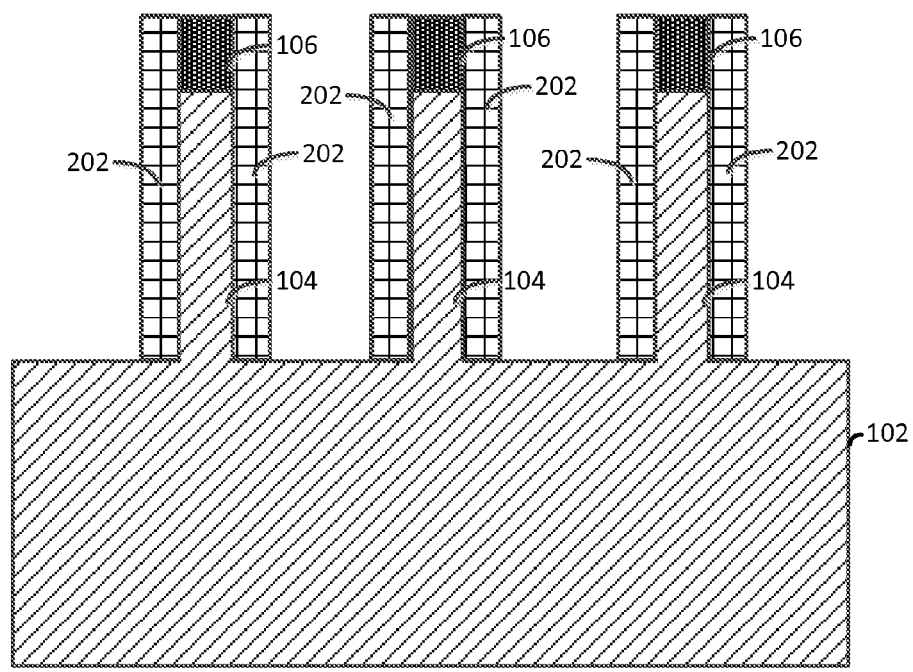
FIG. 2 illustrates a side view following the formation of spacers along sidewalls of the fins.

FIG. 2 illustrates a side view following the formation of spacers 202 along sidewalls of the fins 104. Non-limiting examples of suitable materials for the spacers 202 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer material may be etched by a dry etch process, for example, a RIE process that removes portions of the spacer material to form the spacers 202 as shown in FIG. 2.

Figure 3:
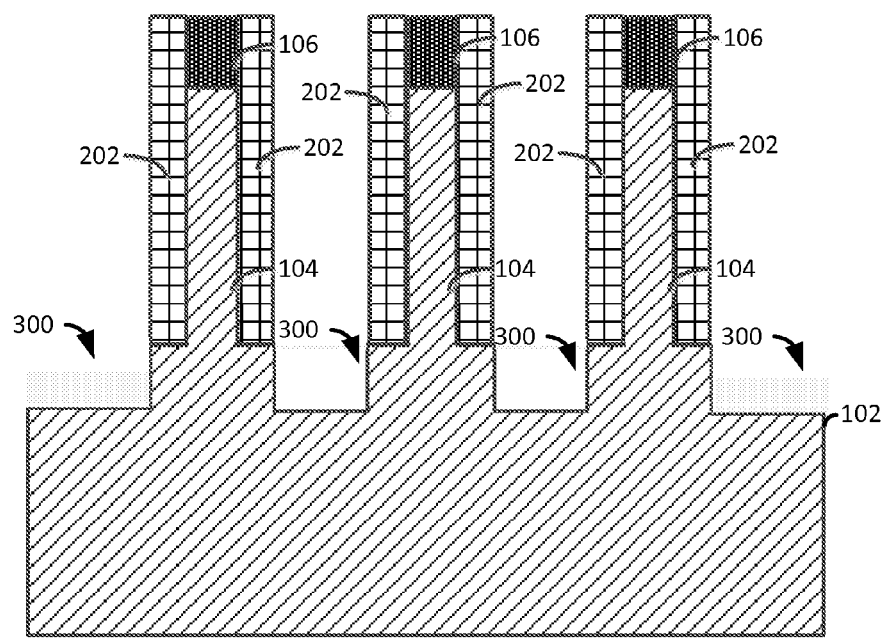
FIG. 3 illustrates a side view of the resultant structure following an anisotropic etching process.

FIG. 3 illustrates a side view of the resultant structure following an anisotropic etching process such as, for example, reactive ion etching. The etching process is selective to the spacer 202 material and the hardmask 106 material such that the etching process removes exposed portions of the substrate material 102 to form trenches 300 in the substrate 102 adjacent to the spacers 202.

Figure 4:
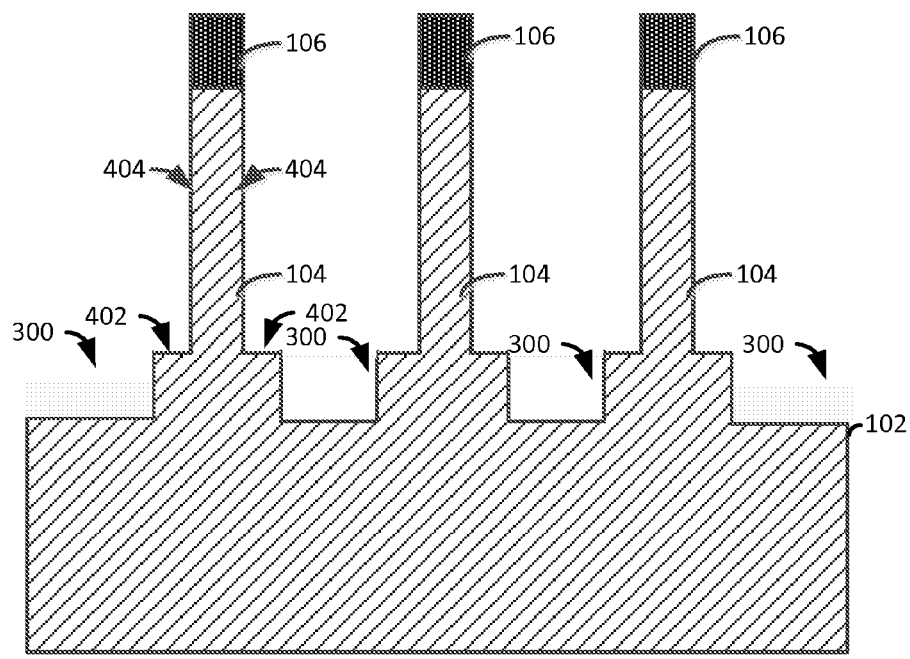
FIG. 4 illustrates a side view of the resultant structure following the removal of the spacers of FIG. 3.

FIG. 4 illustrates a side view of the resultant structure following the removal of the spacers 202 (of FIG. 3). The spacers 202 may be removed by, for example, an etching process such as reactive ion etching or wet chemical removal. The removal of the spacers 202 results in substantially planar surfaces 402 arranged adjacent to sidewalls 404 of the fin 104 between the fin 104 and the trenches 300.

Figure 5:
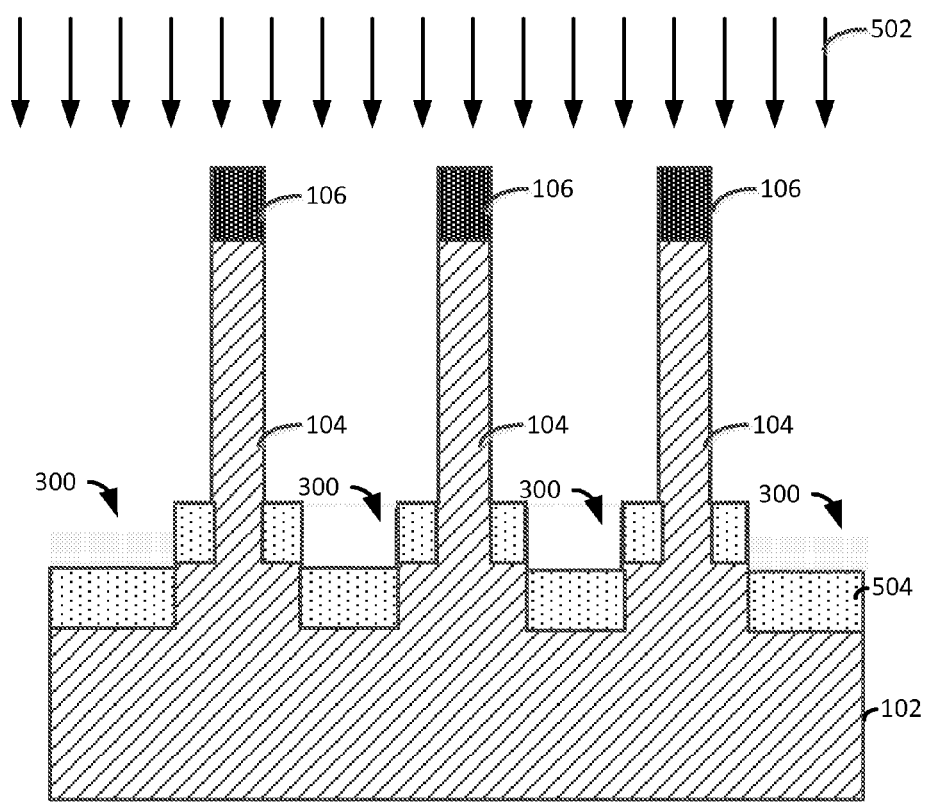
FIG. 5 illustrates a side view of the resultant structure following an ion implantation process.

FIG. 5 illustrates a side view of the resultant structure following an ion implantation process that will form the punch through stopper regions described below. The ion implantation process implants ions 502 to result in doped semiconductor regions 504 in the substrate 102. In this regard, the bottom surfaces of the trenches 300 and the surfaces 402 between the fins 104 and the trenches 300 are doped by ion implantation using a low energy ion implantation process. N-type or p-type dopants such as, for example, arsenic or phosphorus or any other suitable type of dopant may be used depending on the type of device being formed.

Figure 6:
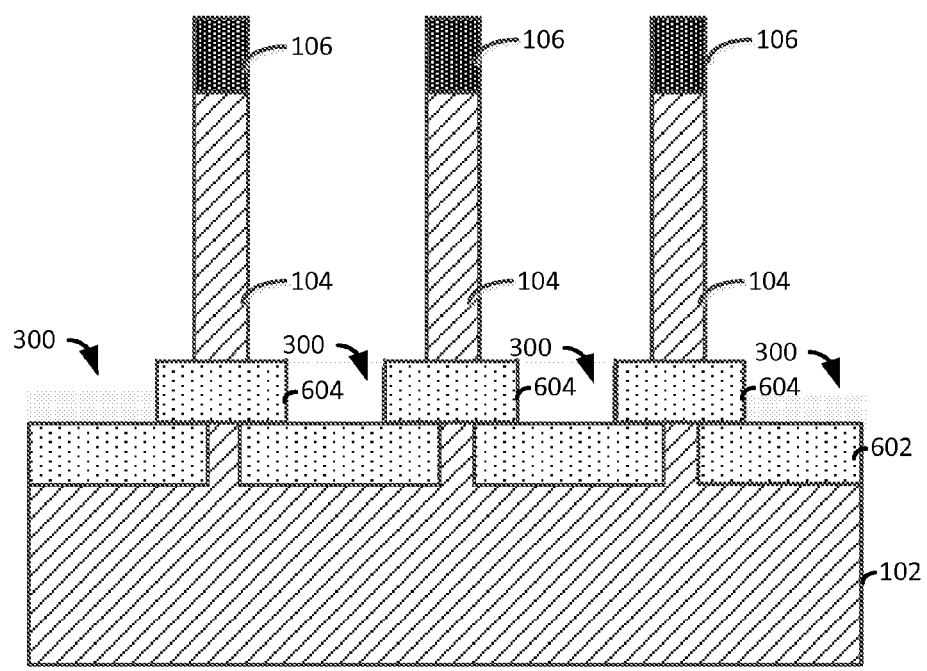
FIG. 6 illustrates a side view of the resultant structure following an annealing process that diffuses ions.

FIG. 6 illustrates a side view of the resultant structure following an annealing process that may be performed at about 1000 degrees Celsius for 5 seconds RTA. The annealing process diffuses the implanted dopants further into the substrate 102 material to form punch through stopper regions 602 and 604. In the illustrated embodiment, the punch through stopper regions 604 extend laterally below the base of the fins 104. The punch through stopper regions 602 extend laterally below the punch through stopper regions 604.

Figure 7:
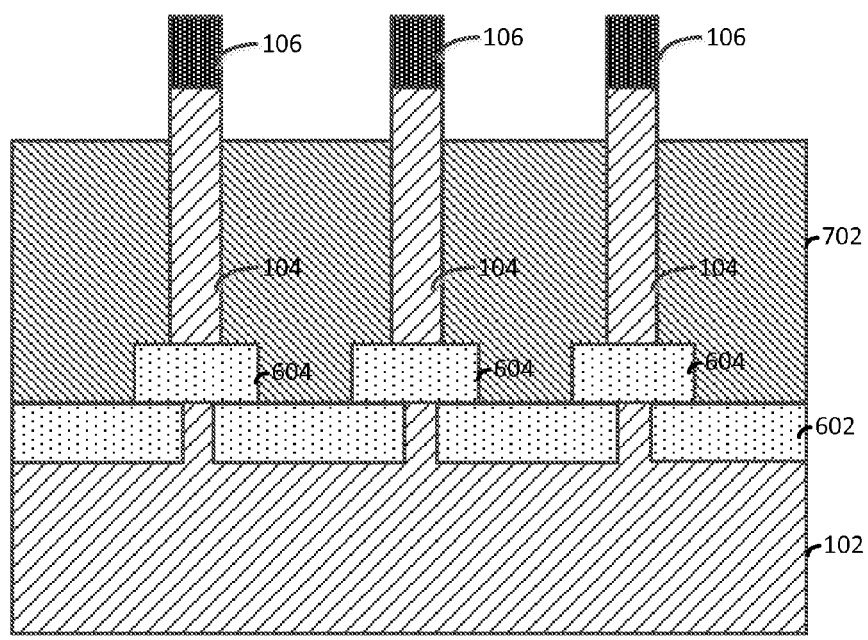
FIG. 7 illustrates a side view following the deposition of an insulator layer over the substrate.

FIG. 7 illustrates a side view following the deposition of an insulator layer 702 over the substrate 102 including portions of the punch through stopper regions 602 and 604. The insulator layer 702 may include, for example, an oxide material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, a flowable oxide process, or any combination thereof.

Figure 8:
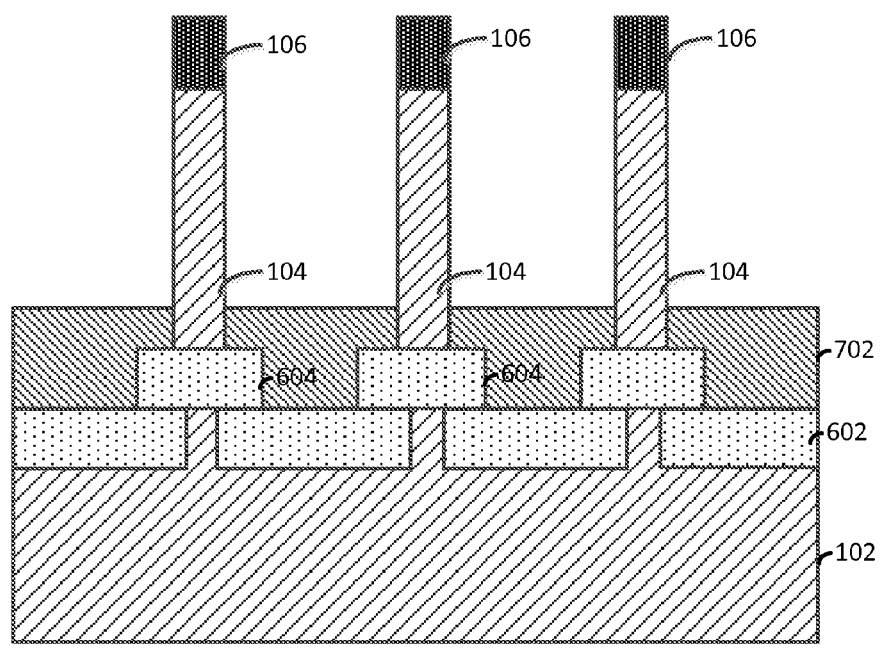
FIG. 8 illustrates a side view of the resultant structure following an etching process that removes exposed portions of the insulator layer.

FIG. 8 illustrates a side view of the resultant structure following an etching process such as, for example, a reactive ion etching process that removes exposed portions of the insulator layer 702 and reduces the thickness of the insulator layer 702. The thickness of the insulator layer 702 substantially defines the height of the fins 104.

Figure 9:
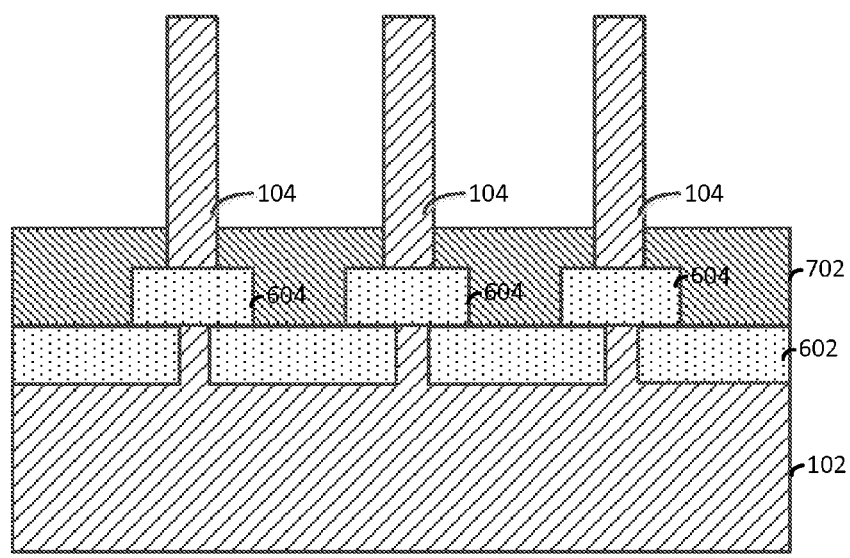
FIG. 9 illustrates a side view following an etching process that selectively removes the hardmask layer of FIG. 8 and further exposes the fins.

FIG. 9 illustrates a side view following an etching process such as, for example, reactive ion etching that selectively removes the hardmask layer 106 (of FIG. 8) and further exposes the fins 104.

Figure 10:
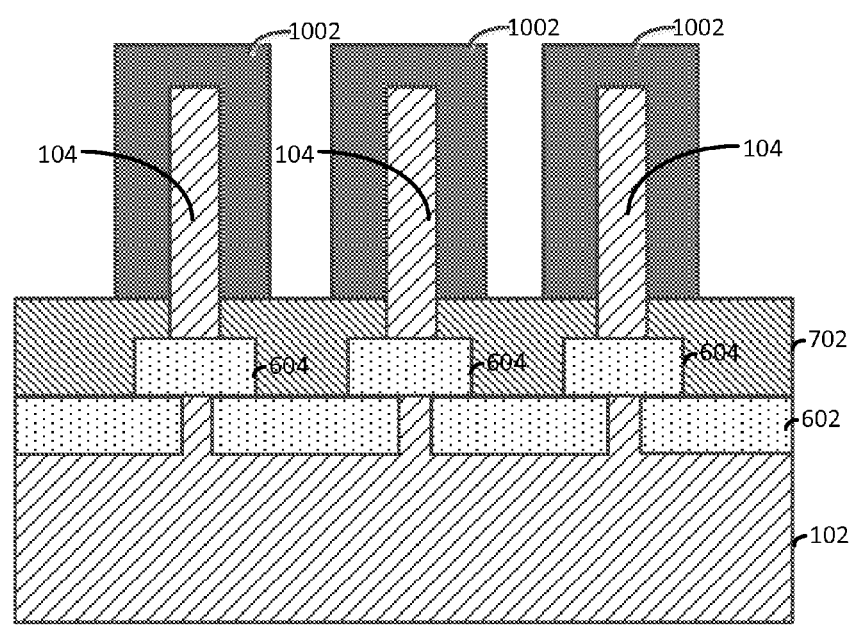
FIG. 10 illustrates a side view of the resultant structure following an epitaxial growth process.

FIG. 10 illustrates a side view of the resultant structure following an epitaxial growth process that grows an epitaxially grown semiconductor material 1002 such as, for example, a silicon germanium material with a relatively high concentration of germanium 30% to 50% on exposed portions of the fins 104. The underlying semiconductor material in the fins 104 acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process.

Figure 11:
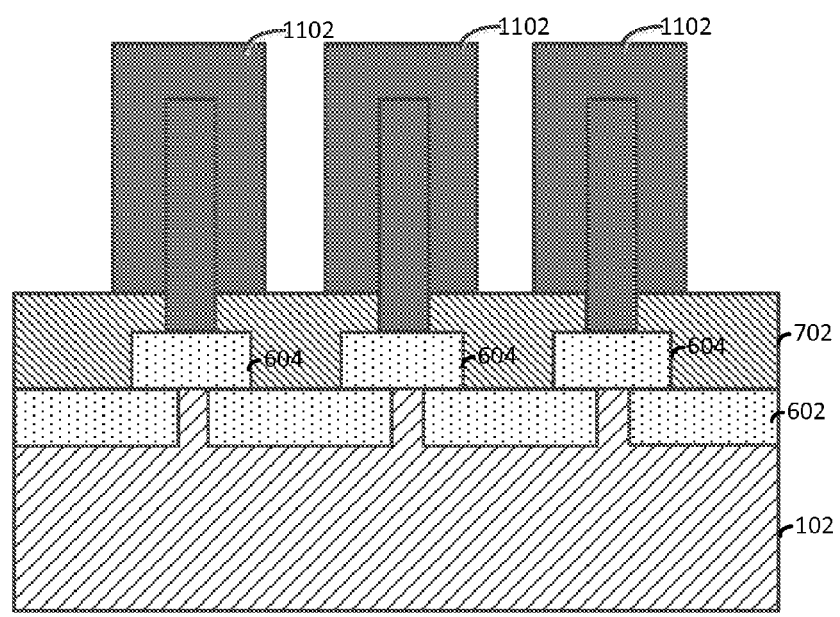
FIG. 11 illustrates a side view of the resultant structure following an oxidation and annealing process further forms the fins.

FIG. 11 illustrates a side view of the resultant structure following an oxidation and annealing process that drives the germanium in the epitaxially grown semiconductor material 1002 into the fins 104 to form silicon germanium fins 1102.

Figure 12:
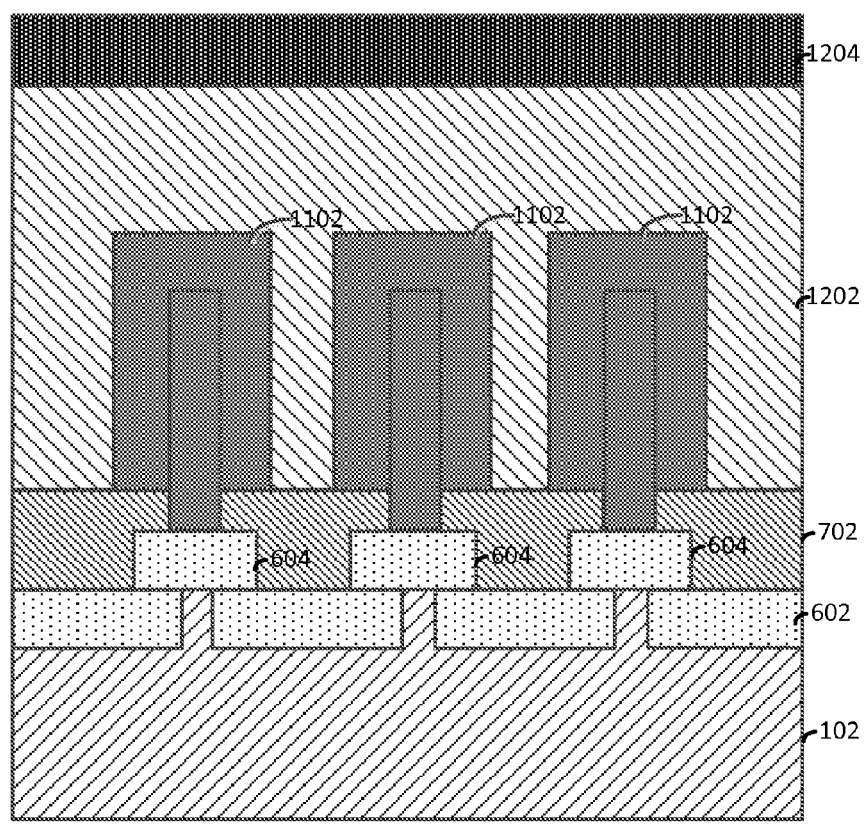
FIG. 12 illustrates a side view following the deposition of a dummy gate material layer over the insulator layer and the fins.

FIG. 12 illustrates a side view following the deposition of a dummy gate material layer 1202 over the insulator layer 702 and the fins 1102. The dummy gate material layer 1202 may include, for example, amorphous silicon (polysilicon). An insulating hard mask layer 1204 for example, silicon nitride (SiN), SiOCN, or SiBCN is deposited on the dummy gate material layer 1202 to form the hardmask layer 1204.

Figure 13:
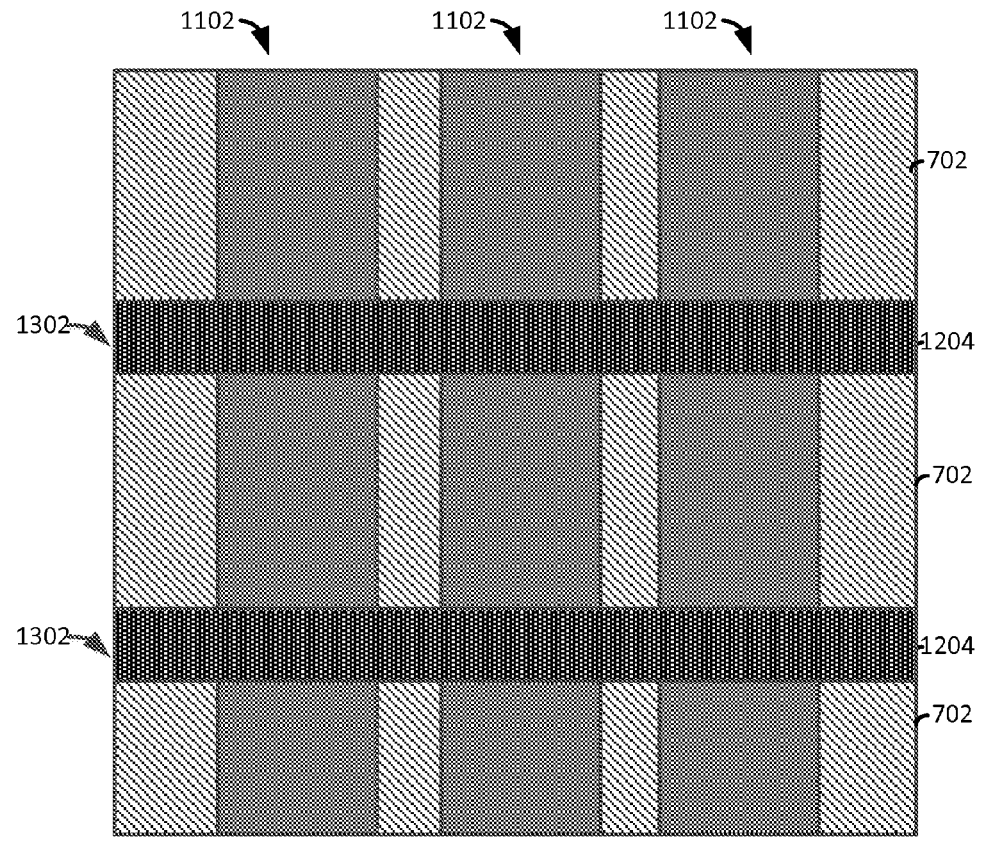
FIG. 13 illustrates a top view following the formation of dummy gates.

FIG. 13 illustrates a top view following the formation of dummy gates 1302. The hard mask layer 1204 and the dummy gate material layer 1202 are patterned and etched to form the dummy gates 1302 covered by hard masks 1204 and expose portions of the fins. For example, a photoresist (not shown) is patterned by exposing to a desired pattern of radiation. Then the exposed photoresist is developed and with a resist developer to provide a patterned photoresist over the hard mask layer 1204. The photoresist pattern is transferred through the hard mask material and replacement gate material by performing a suitable etching process. Then the photoresist is removed. Any other suitable patterning technique (e.g., sidewall imaging transfer) may also be used to pattern the dummy gates 1302.

Figure 14:
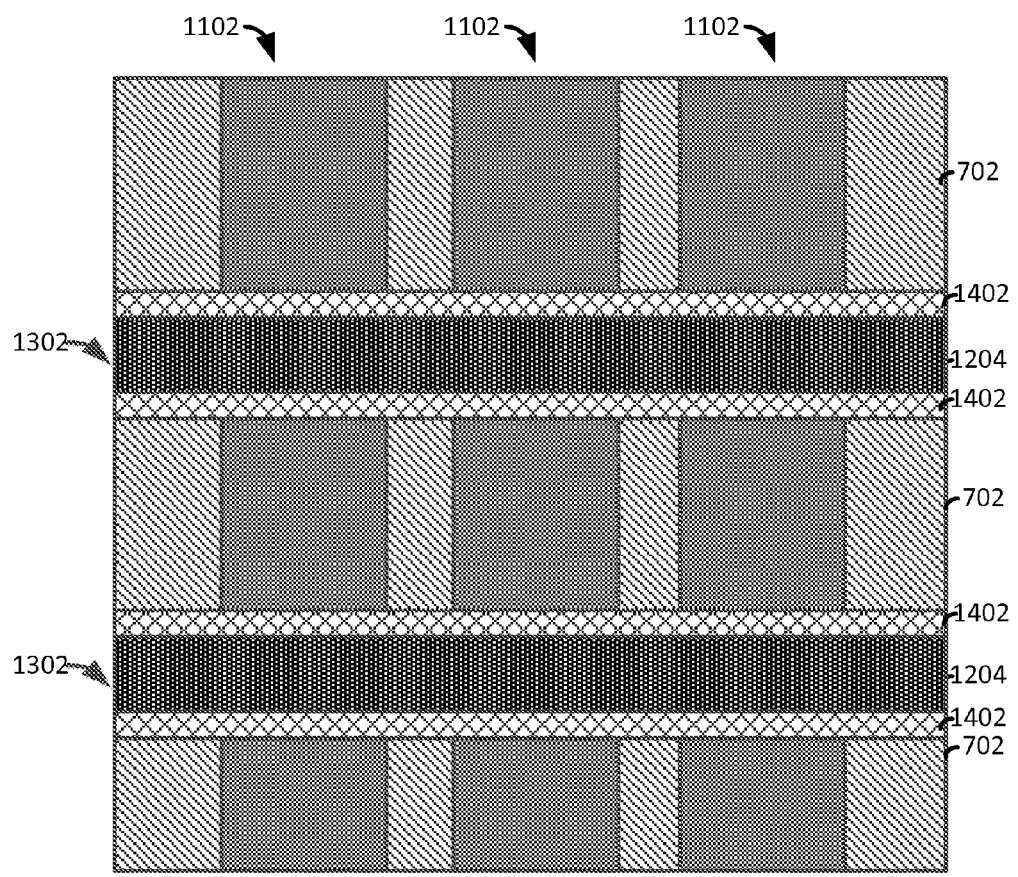
FIG. 14 illustrates a top view of the resultant structure following the formation of spacers adjacent to the dummy gate stacks.

FIG. 14 illustrates a top view of the resultant structure following the formation of spacers 1402 adjacent to the dummy gate stacks 1102. The low-k spacers 1402 may contain Si, N, and at least one element selected from the group consisting of C and B. Additionally, the low-k spacers 1402 may contain Si, N, B, and C. For example, the low-k spacer material 1402 may include SiBN, SiCN, SiBCN, or any combination thereof. The spacers 1402 may be formed by, for example, depositing the spacer material and performing an anisotropic etch such as, for, example, reactive ion etching, which results in the spacers 1402. The spacers 1402 are used for forming source/drain regions at regions slightly away from the gate. When the spacers 1402 are etched by an anisotropic process, some of the spacer material remains along the gate sidewalls and is not etched away because the thickness of the spacer material is larger in the vertical direction.

Following the formation of the dummy gates 1302 and spacers 1402, active regions in the fins 1102 may be formed by, for example, ion implantation, an in-situ epitaxial growth process, or an epitaxial growth process followed by an ion implantation process. The active regions of the fins 1102.

Figure 15A:
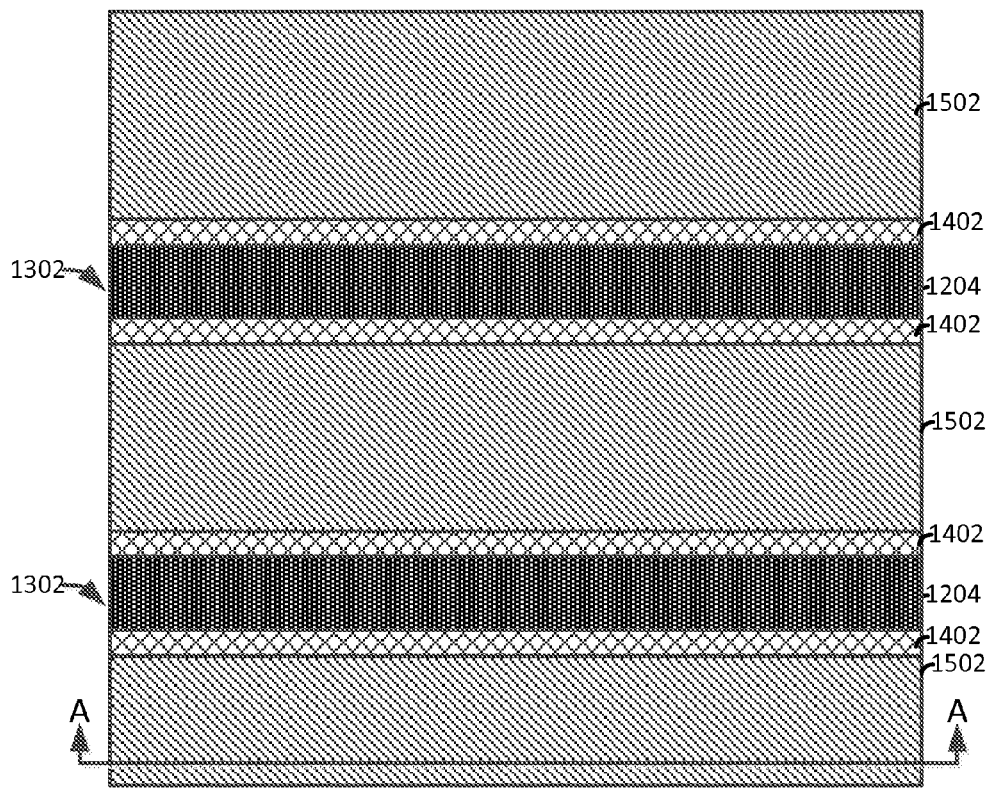
FIG. 15A illustrates a top view following the formation of an inter-level dielectric (ILD) layer.

FIG. 15A illustrates a top view following the formation of an inter-level dielectric (ILD) layer 1502 over the exposed portions of the insulator layer 702 and the fins 1102 (of FIG. 14). The inter-level dielectric (ILD) layer 1502 may be formed from, for example, a low-k dielectric oxide, including but not limited to, silicon dioxide, spin-on-glass, a flowable oxide, a high density plasma oxide, borophosphosilicate glass (BPSG), or any combination thereof.

The low-k dielectric oxide layer 1502 is deposited by a suitable deposition process, including, but not limited to CVD, PVD, plasma enhanced CVD, atomic layer deposition (ALD), evaporation, chemical solution deposition, or like processes. The ILD layer 1502 may further comprise a liner (e.g., silicon nitride) (not shown) that is deposited before the oxide.

Following the deposition of the inter-level dielectric layer 1502, a planarization process such as, for example, chemical mechanical polishing (CMP) may be performed to remove portions of the inter-level dielectric layer 1502 and expose the dummy gates 1302.

Figure 15B:
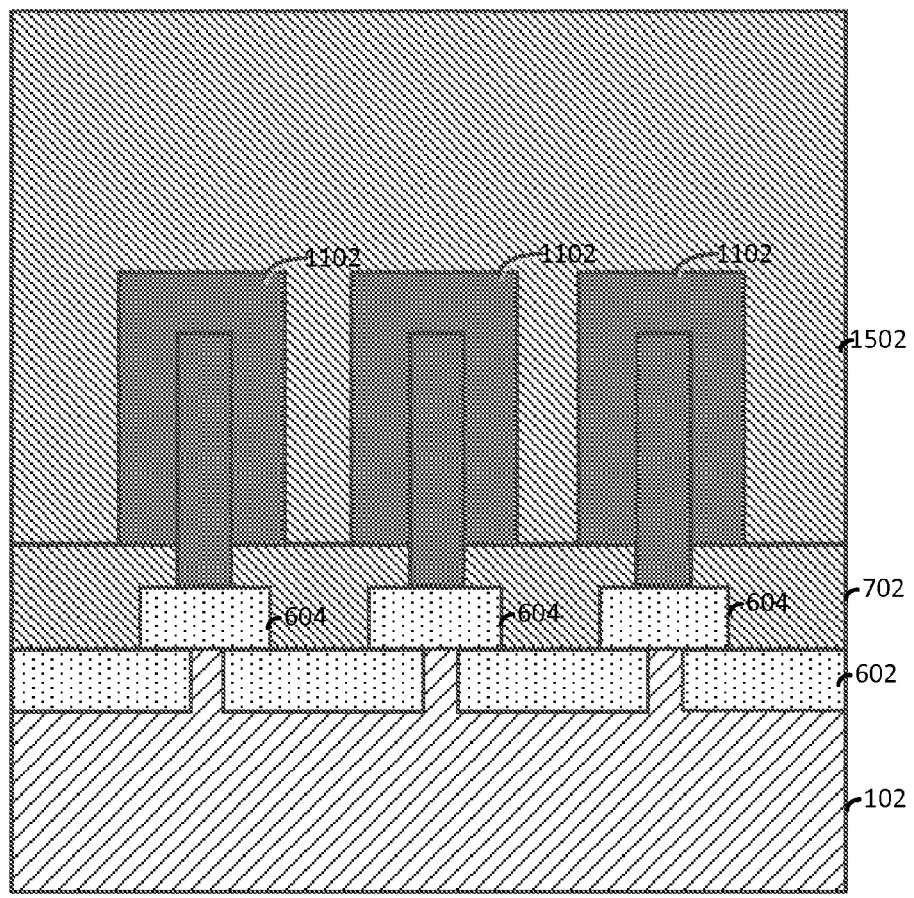
FIG. 15B illustrates a side cut away view following the formation of an inter-level dielectric (ILD) layer along the line A-A of FIG. 15A.

FIG. 15B illustrates a side cut away view of along the line A-A of FIG. 15A.

Figure 16:
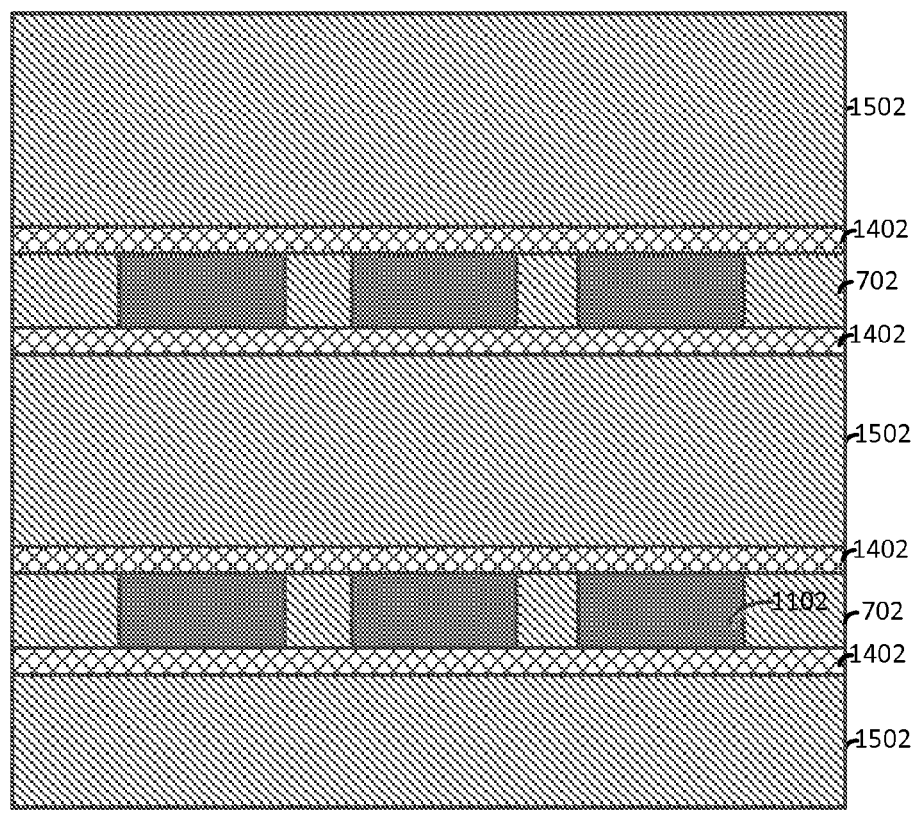
FIG. 16 illustrates a top view of following the removal of the dummy gates of FIG. 15A.

FIG. 16 illustrates a top view of following the removal of the dummy gates 1302 (of FIG. 15A), which exposes channel regions of the fins 1102 and portions of the insulator layer 702. The dummy gates 1302 may be removed by, for example, a selective etching process that removes exposed polysilicon material.

Figure 17A:
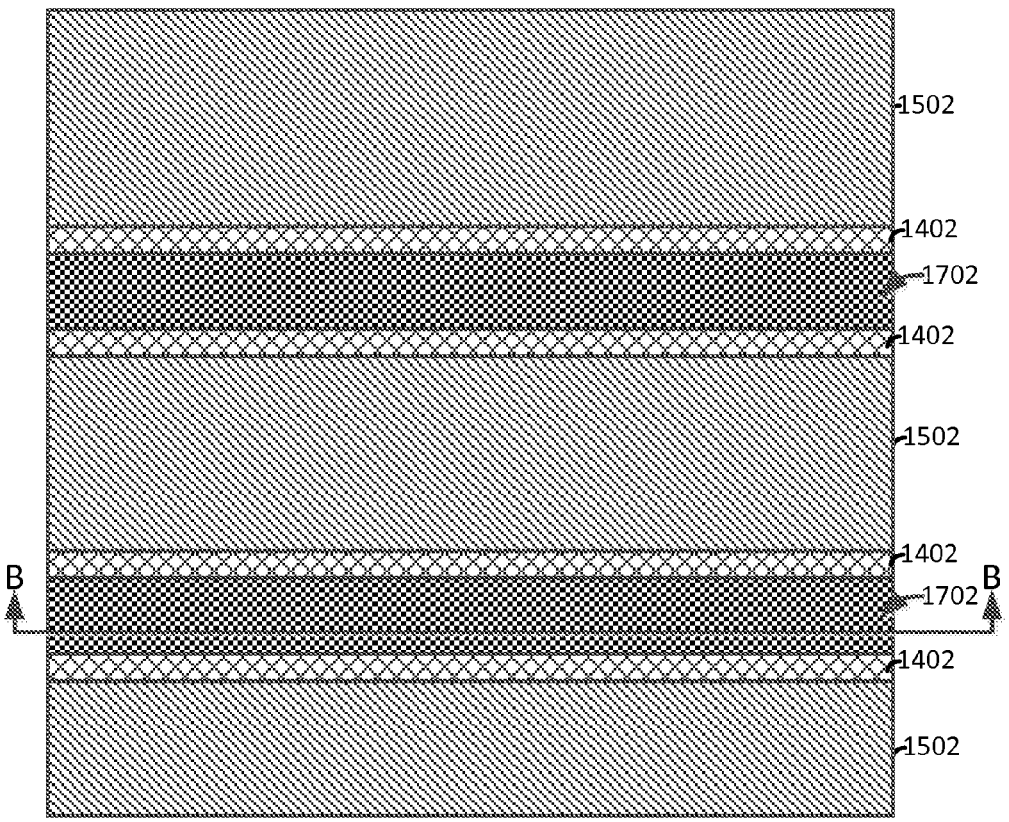
FIG. 17A illustrates a top view of the resultant structure following the formation of gate stacks.
Figure 17B:
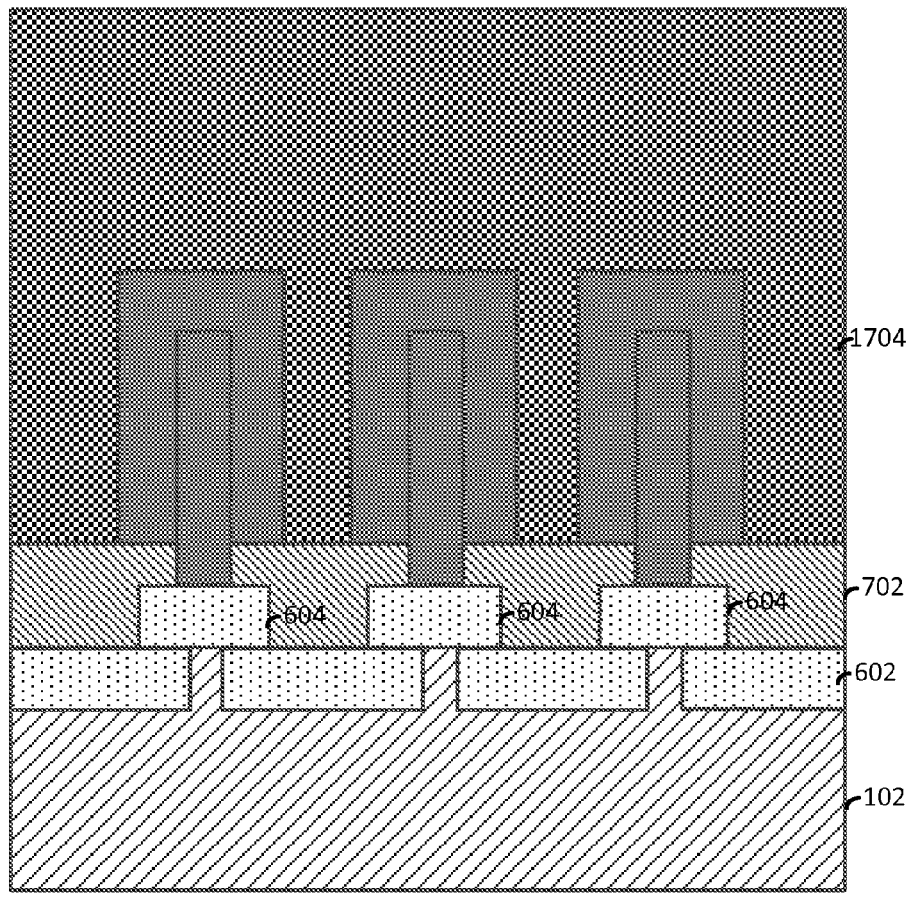
FIG. 17B illustrates a side cut-away view of the resultant structure following the formation of gate stacks along the line B-B of FIG. 17A.

FIG. 17A illustrates a top view of the resultant structure following the formation of gate stacks 1702. FIG. 17B illustrates a side cut-away view along the line B-B of FIG. 17A. The gate stack 1702 includes high-k metal gates formed, for example, by filling a dummy gate opening of (FIG. 16) with one or more high-k dielectric materials (not shown), one or more workfunction metals 1704 (of FIG. 17B), and one or more metal gate conductor materials (not shown). The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) 1704 may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The embodiments described herein provide a punch through stopper for a finFET device that has semiconductor fins with high concentrations of germanium. The punch through stoppers are formed without substantially diffusing undesirable dopants into the channel regions of the fins.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a fin comprising silicon germanium arranged on a semiconductor substrate;
   a first punch through stopper region arranged in the semiconductor substrate below the fin;
   a second punch through stopper region arranged in the semiconductor substrate in a trench defined by the semiconductor substrate and the first punch through stopper region; and
   a gate stack arranged over a channel region of the fin.

2. The device of claim 1, wherein the first punch through stopper region extends below the fin such that the fin is arranged over the first punch through stopper region, and the first punch through stopper region is arranged over a substantially undoped portion of the semiconductor substrate.

* * * * *